(12) United States Patent
Hoshika et al.

(10) Patent No.: US 12,090,935 B2
(45) Date of Patent: Sep. 17, 2024

(54) PROTECTOR STRUCTURE FOR ELECTRICAL COMPONENT

(71) Applicant: NISSAN MOTOR CO., LTD., Yokohama (JP)

(72) Inventors: Seiji Hoshika, Kanagawa (JP); Yusuke Fukuhara, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 17/921,220

(22) PCT Filed: Apr. 27, 2020

(86) PCT No.: PCT/JP2020/017991
§ 371 (c)(1),
(2) Date: Oct. 25, 2022

(87) PCT Pub. No.: WO2021/220348
PCT Pub. Date: Nov. 4, 2021

(65) Prior Publication Data
US 2023/0166666 A1 Jun. 1, 2023

(51) Int. Cl.
*B60R 16/02* (2006.01)
*H05K 5/02* (2006.01)

(52) U.S. Cl.
CPC ....... *B60R 16/0215* (2013.01); *H05K 5/0217* (2013.01)

(58) Field of Classification Search
CPC .............. B60R 16/0215; H05K 5/0217
See application file for complete search history.

(56) References Cited

U.S. PATENT DOCUMENTS

| 6,662,891 | B2 * | 12/2003 | Misu ................. B60W 10/30 903/952 |
| 7,392,782 | B2 | 7/2008 | Fujii |
| 8,256,552 | B2 * | 9/2012 | Okada ............... H01M 10/625 180/68.5 |
| 8,567,543 | B2 * | 10/2013 | Kubota ................. B60L 58/26 180/68.5 |
| 9,485,881 | B2 * | 11/2016 | Nagamori ............. H05K 5/03 |
| 9,837,645 | B2 * | 12/2017 | Katayama ........... H01M 50/296 |
| 2011/0139595 | A1 * | 6/2011 | Ishigaki ................ B60L 3/04 200/52 R |
| 2012/0031689 | A1 | 2/2012 | Kanno |
| 2013/0341963 | A1 | 12/2013 | Hirano et al. |
| 2014/0097641 | A1 | 4/2014 | Hayano |
| 2015/0121767 | A1 | 5/2015 | Nagamori et al. |

(Continued)

FOREIGN PATENT DOCUMENTS

| CN | 102458891 B | 5/2012 |
| CN | 103402802 A | 11/2013 |

(Continued)

*Primary Examiner* — Toan C To
(74) *Attorney, Agent, or Firm* — Foley & Lardner LLP

(57) ABSTRACT

A protector structure for an inverter 1 which is an example of an electrical component includes a protector 3 including a protection portion 31, an attachment portion 32A and an attachment portion 32B. The protector 3 has a constricted portion 33A between the protection portion 31 and the attachment portion 32A, and has a constricted portion 33B between the protection portion 31 and the attachment portion 32B.

7 Claims, 11 Drawing Sheets

(56) References Cited

U.S. PATENT DOCUMENTS

2016/0248059 A1\* 8/2016 Katayama ................ B60K 1/04
2018/0317282 A1\* 11/2018 Rogers ................ B60R 16/0215
2019/0229509 A1\* 7/2019 Mita .................... H01B 7/0045
2019/0322182 A1\* 10/2019 Isotani ................ B60R 16/0215
2021/0094486 A1\* 4/2021 Fuchigami ........... H01B 7/0045

FOREIGN PATENT DOCUMENTS

| JP | 2013-066327 A | 4/2013 |
| JP | 2013-121779 A | 6/2013 |
| JP | 2013-237413 A | 11/2013 |
| JP | 2014-076685 A | 5/2014 |

\* cited by examiner

PROTECTOR STRUCTURE FOR ELECTRICAL COMPONENT

TECHNICAL FIELD

The present invention relates to a protector structure for an electrical component.

BACKGROUND ART

JP2014-076685A discloses a technique of attaching a protector to a presumable breakage portion as a countermeasure against breakage due to a collision.

SUMMARY OF INVENTION

The protector having high strength can prevent a load from being input to the presumable breakage portion at the time of a collision of a colliding object. However, the higher the strength of the protector, the smaller the possibility of deformation of the protector. As a result, in this case, the collision load is concentrated on an attachment portion of the protector, and a case of an electrical component may be broken at a portion where the attachment portion is provided.

The present invention has been made in view of such a problem, and an object thereof is to prevent breakage of a case of an electrical component due to a collision load via an attachment portion of a protector.

A protector structure for an electrical component according to one aspect of the present invention includes a protector including a protection portion configured to protect the electrical component from a collision of a colliding object, and an attachment portion to a member including a case of the electrical component. The protector includes a low-strength portion between the protection portion and the attachment portion, the low-strength portion having lower strength than the protection portion and the attachment portion.

DESCRIPTION OF EMBODIMENTS

Hereinafter, an embodiment of the present invention will be described with reference to the accompanying drawings.

Figure 1:
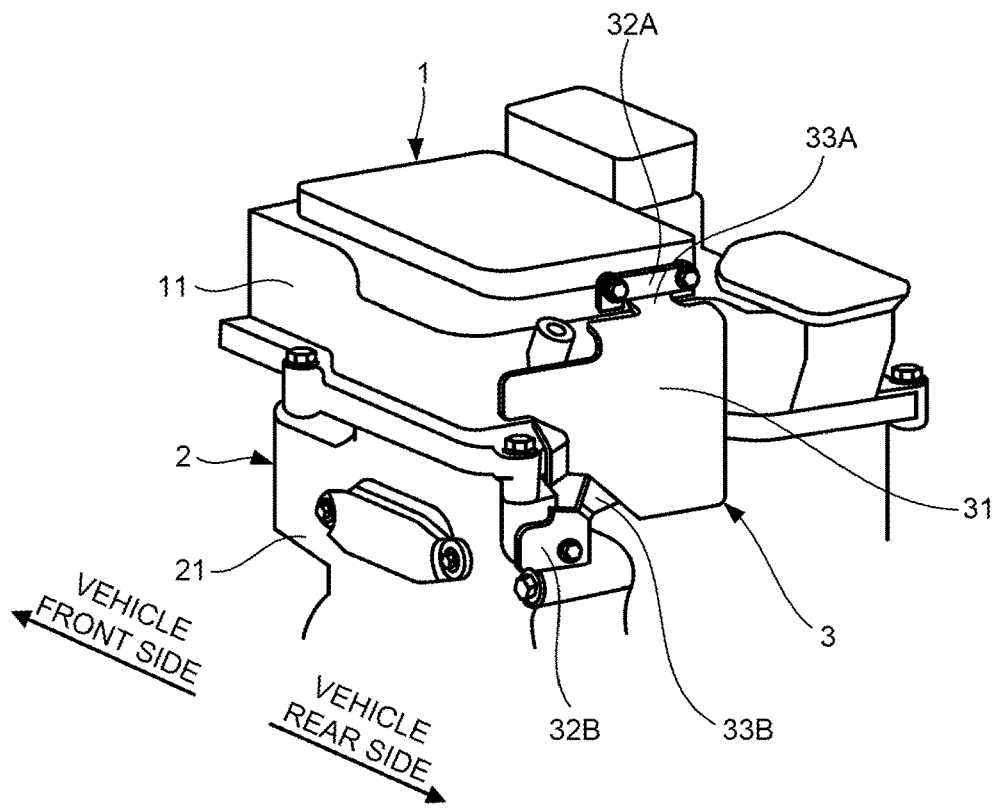
FIG. 1 is a first external view of a protector structure for an inverter.
Figure 2:
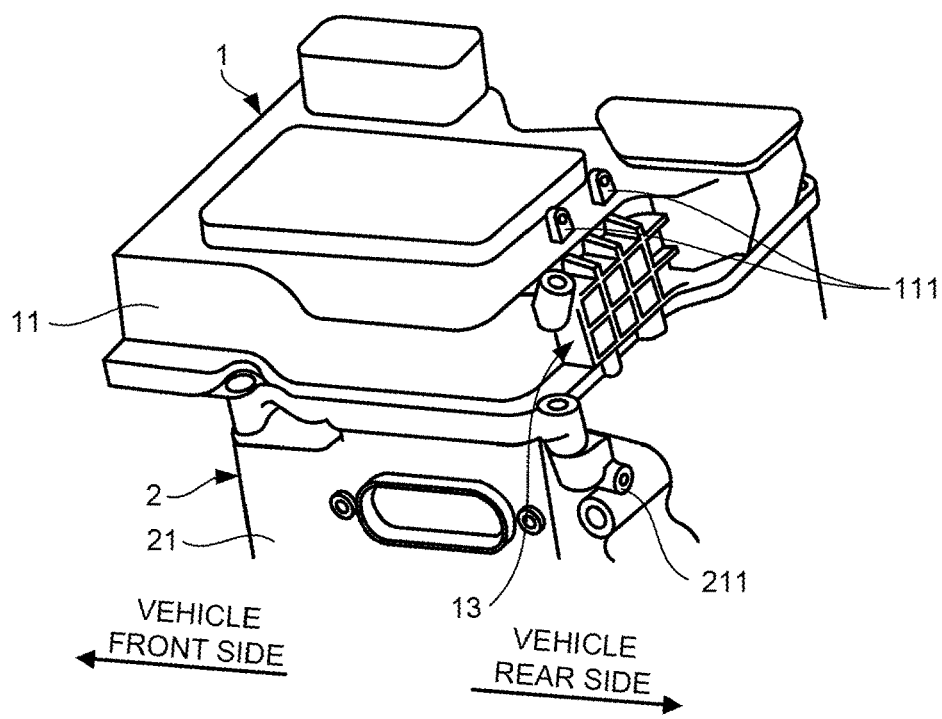
FIG. 2 is a second external view of the protector structure for the inverter.
Figure 3:
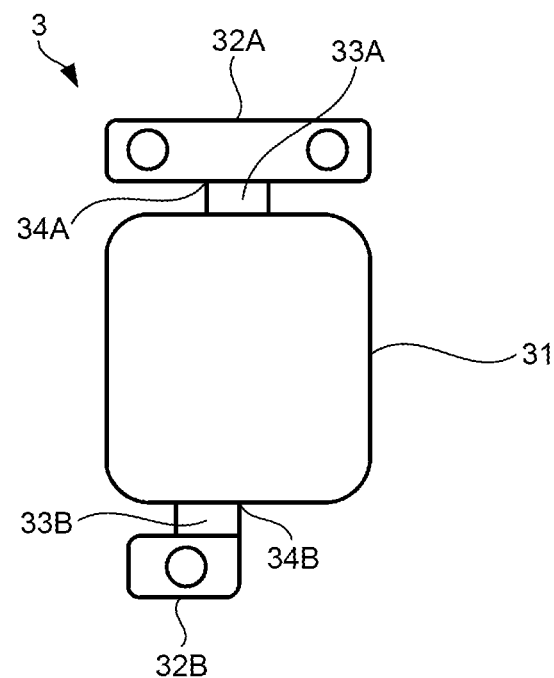
FIG. 3 is a schematic plan view of the protector.
Figure 4:
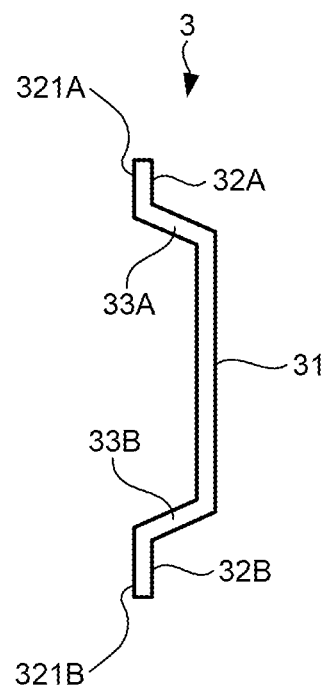
FIG. 4 is a schematic side view of the protector.

FIGS. 1 and 2 are external views of a protector structure for an inverter 1. FIG. 3 is a schematic plan view of a protector 3. FIG. 4 is a schematic side view of the protector 3. FIG. 2 shows the protector structure in a state where the protector 3 is removed.

The protector structure includes the inverter 1, a motor 2, and the protector 3. The inverter 1 is an example of an electrical component and disposed above the motor 2. A case 11 of the inverter 1 is fixed to a case 21 of the motor 2 by bolt fastening, and thus the inverter 1 and the motor 2 form an integrated structure.

The motor 2 constitutes a drive source of a vehicle. The motor 2 is housed in a motor room of the vehicle together with the inverter 1. The vehicle is a series hybrid vehicle that travels by driving the motor 2 using electric power generated by a generator using power of an internal combustion engine.

The protector 3 is provided for the inverter 1. The protector 3 is formed of a plate-shaped member and extends from the inverter 1 to the motor 2. The protector 3 includes a protection portion 31, an attachment portion 32A, a constricted portion 33A, an attachment portion 32B, and a constricted portion 33B.

The protection portion 31 protects the inverter 1 from a collision of a colliding object. The colliding object is a vehicle component disposed in the motor room, and is a master cylinder 4 to be described later in the present embodiment. The protection portion 31 has a flat plate shape and constitutes a protector surface of the protector 3.

A receiving portion 13 that is raised higher than surrounding positions is provided at a portion of the case 11 where the protection portion 31 faces. The receiving portion 13 is a portion raised from a wall surface of the case 11 on which the receiving portion 13 is provided. The receiving portion 13 is formed of ribs having a mesh shape. The case 11 may not include the receiving portion 13.

The attachment portion 32A is attached to the case 11. The attachment portion 32A is in a state of being attached by bolts that are fixing members. As illustrated in FIG. 4, the attachment portion 32A includes contact portions 321A with the case 11, and is attached in a state of surface contact with the case 11 at the contact portions 321A.

The contact portions 321A are formed around bolt holes, and are in surface contact with attachment portions 111 of the case 11 illustrated in FIG. 2. Two contact portions 321A and two attachment portions 111 are provided.

The attachment portion 32A configured as described above is attached to the case 11 in a state where at least a part of the attachment portion 32A is in surface contact with the case 11. Such an attachment portion 32A is grasped as an attachment portion by interposing the constricted portion 33A, which is a low-strength portion, between the protection portion 31 and the attachment portion 32A.

The constricted portion 33A is provided between the protection portion 31 and the attachment portion 32A. The constricted portion 33A has a constriction with respect to the protection portion 31 and the attachment portion 32A. Therefore, strength of the constricted portion 33A is lower than that in a case where the constricted portion 33A has the same width as the narrower one of the protection portion 31 and the attachment portion 32A, that is, in a case where the constricted portion 33A is not constricted to any one of the protection portion 31 and the attachment portion 32A. A width direction can be a direction orthogonal to a thickness direction of the protector 3 and an extending direction of the constricted portion 33A.

In such a constricted portion 33A, the strength against the collision of the colliding object with the protection portion 31 is lower than those of the protection portion 31 and the attachment portion 32A. Therefore, when the colliding object collides with the protection portion 31, the protector 3 is easily deformed at the constricted portion 33A.

The constricted portion 33A has a two-side constricted shape which is constricted on both side portions with respect to the protection portion 31 and the attachment portion 32A. The constricted portion 33A is connected to the attachment portion 32A at a position inside the two contact portions 321A in the width direction by being connected to a central portion of the attachment portion 32A.

The protector 3 is configured such that one constricted portion 33A is connected to one attachment portion 32A. In this case, since the strength of the constricted portion 33A can be adjusted by adjusting the width of the constricted portion 33A at one place, the strength of the constricted portion 33A in the protector 3 can be easily adjusted.

The attachment portion 32B is attached to the case 21 of the motor 2. The attachment portion 32B is in a state of being attached by a bolt. As illustrated in FIG. 4, the attachment portion 32B includes a contact portion 321B with the case 21, and is attached in a state of surface contact with the case 21 at the contact portion 321B. The contact portion 321B is formed around a bolt hole, and is in surface contact with an attachment portion 211 of the case 21 illustrated in FIG. 2. One contact portion 321B and one attachment portion 211 are provided.

The constricted portion 33B is provided between the protection portion 31 and the attachment portion 32B. The constricted portion 33B has a constriction with respect to the protection portion 31 and the attachment portion 32B. As illustrated in FIG. 3, the constricted portion 33B has a one-side constricted shape which is constricted on one side portion with respect to the protection portion 31 and the attachment portion 32B. The contact portion 321B formed around the bolt hole is provided in a manner of overlapping with a region on an outer side in a width direction with respect to a width of a connection portion between the attachment portion 32B and the constricted portion 33B. Like the constricted portion 33A, the constricted portion 33B may have a two-side constricted shape. The protector 3 is configured such that one constricted portion 33B is connected to one attachment portion 32B.

As illustrated in FIG. 3, corner portions 34A and corner portions 34B are formed in the protector 3 due to the constricted shape. The corner portions 34A are formed at a connection position between the protection portion 31 and the constricted portion 33A and at a connection position between the constricted portion 33A and the attachment portion 32A. The corner portions 34B are formed at a connection position between the protection portion 31 and the constricted portion 33B and a connection position between the constricted portion 33B and the attachment portion 32B.

A stress is likely to concentrate on the corner portions 34A and the corner portions 34B. Therefore, strength of the protector 3 against the collision of the colliding object with the protection portion 31 is further reduced by the corner portions 34A and the corner portions 34B. A total of four corner portions 34A are formed at the above-described connection positions, and a total of three corner portions 34B are formed at the above-described connection positions. The attachment portion 32A and the attachment portion 32B constitute attachment portions to the case 11 and the case 21, which are members including the case 11.

Figure 5:
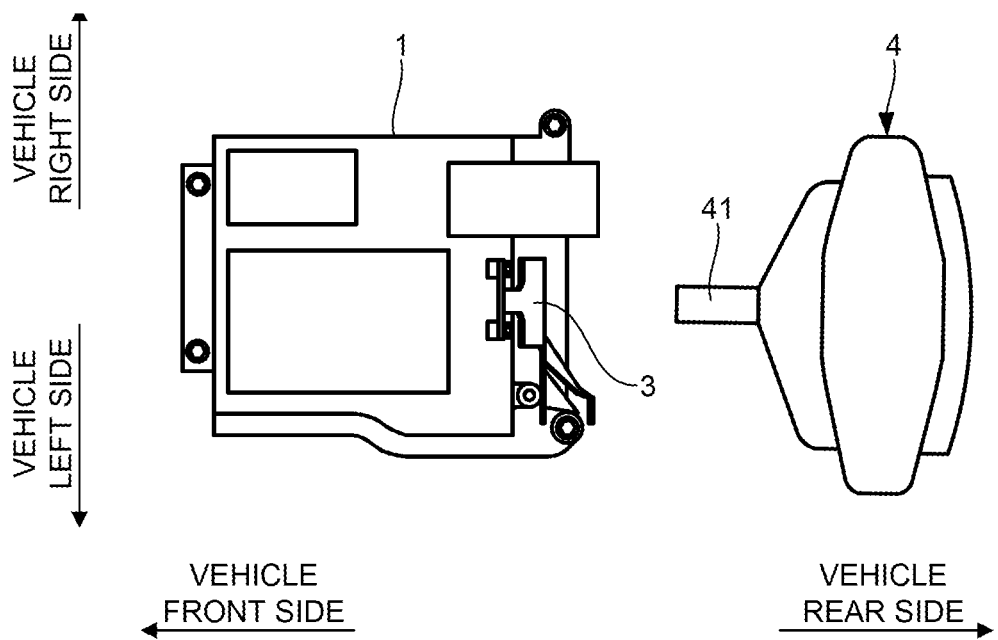
FIG. 5 is a first view illustrating arrangements of the protector and a colliding object.
Figure 6:
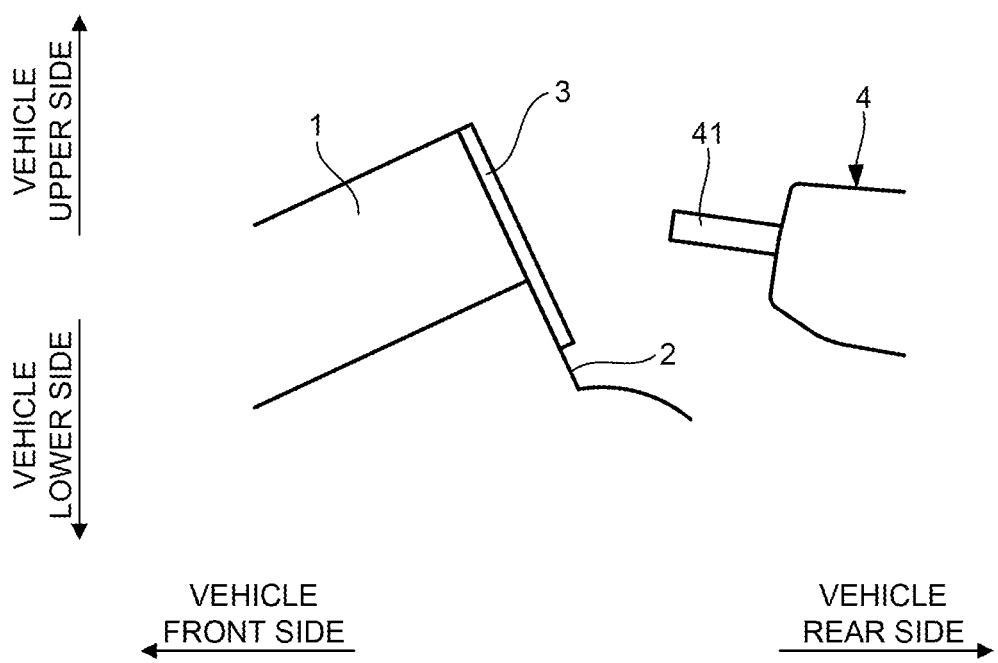
FIG. 6 is a second view illustrating the arrangements of the protector and the colliding object.

FIGS. 5 and 6 are views illustrating arrangements of the protector 3 and the colliding object. FIG. 5 illustrates a case where these arrangements are viewed from above. FIG. 6 illustrates a case where these arrangements are viewed from the side.

As illustrated in FIG. 5, the master cylinder 4, which is the colliding object, is provided at a rear of the vehicle with respect to the inverter 1. As illustrated in FIG. 6, the inverter 1 is provided in a manner of being inclined toward a front of the vehicle, and in this state, a protrusion 41, which is a collision portion, is disposed at a position overlapping with the inverter 1 when viewed along a vehicle front-rear direction.

Therefore, when the inverter 1 moves toward the rear of the vehicle at the time of a vehicle collision, the protrusion 41 may collide with the inverter 1. In order to protect the inverter 1 from such a collision of the protrusion 41, the protector 3 is provided to face the protrusion 41 in the vehicle front-rear direction.

Cells of the receiving portion 13 described above with reference to FIG. 2 are each set to be smaller than a size of a collision cross section of the protrusion 41. The collision cross section is a cross section of a portion that may come into contact with the protection portion 31 at the time of the collision, and is, for example, a vertical cross section (cross section taken along a plane orthogonal to an extending direction of the protrusion 41). The collision cross section may be a cross section taken along a plane orthogonal to the vehicle front-rear direction. Alternatively, the collision cross section may be a cross section taken along a plane connecting rib ridges forming the cells of the receiving portion 13.

Accordingly, even if the receiving portion 13 is formed of the ribs having the mesh shape, when a collision load is input to the receiving portion 13 from the protrusion 41 via the protection portion 31, the load can be received by the strong ribs.

Figure 7:
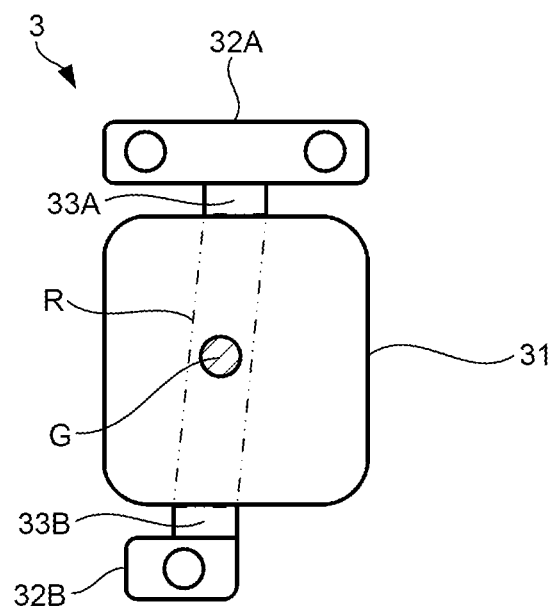
FIG. 7 is a view illustrating a relationship between an arrangement of a gravity center of the protector and a predetermined region.

FIG. 7 is a view illustrating a relationship between an arrangement of a gravity center G of the protector 3 and a region R. The region R is a region surrounded by an outer edge of a region formed by connecting roots of the constricted portion 33A and the constricted portion 33B connected to the protection portion 31, that is, connecting connection base portions of the protection portion 31 with the attachment portion 32A and the attachment portion 32B, and the gravity center G of the protector 3 is disposed in the region R.

Accordingly, the collision load input to the protector 3 is transmitted to the attachment portion 32A and the attachment portion 32B in a well-balanced manner. Accordingly, the protector 3 is less likely to be deformed obliquely with respect to the input load.

Figure 8:
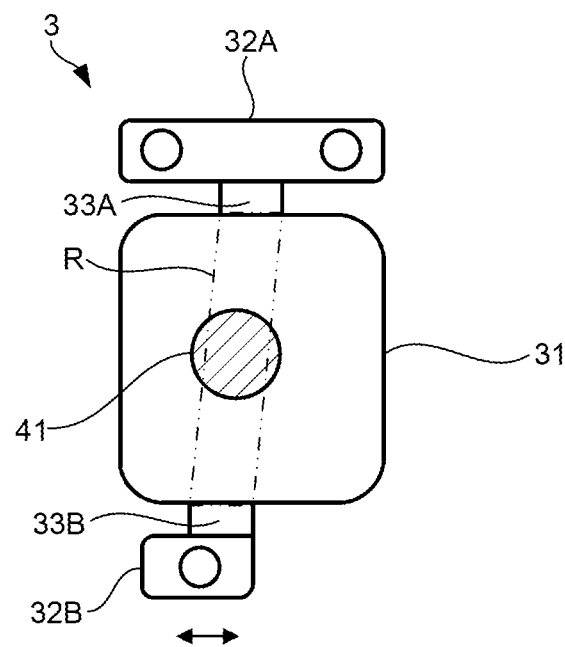
FIG. 8 is a view illustrating a relationship between an arrangement of a protrusion and the predetermined region.

FIG. 8 is a view illustrating a relationship between an arrangement of the protrusion 41 and the region R. The region R and the protrusion 41 overlap each other when viewed along the vehicle front-rear direction. Accordingly, the protrusion 41 easily collides with the protection portion 31 in the region R at the time of the vehicle collision, and the collision load is transmitted to the attachment portion 32A and the attachment portion 32B in a well-balanced manner.

Next, a main operation and effect of the present embodiment will be described.

Figure 9A:
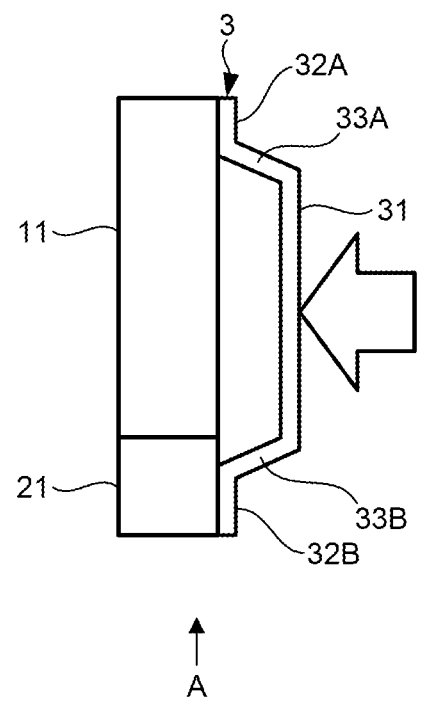
FIG. 9A is a first view of a first illustrative view of deformation of the protector.
Figure 9B:
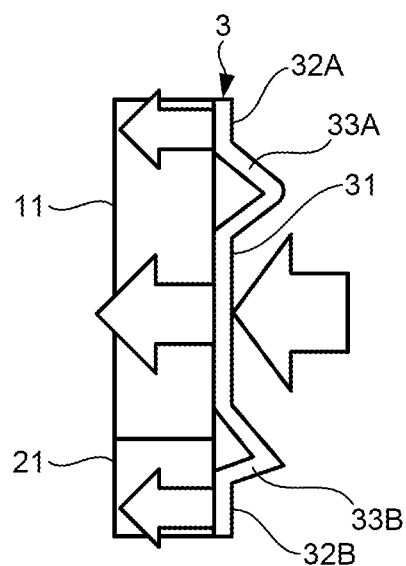
FIG. 9B is a second view of the first illustrative view of the deformation of the protector.

FIGS. 9A and 9B are first illustrative views of deformation of the protector 3. In FIGS. 9A and 9B, a case where the case 11 does not include the receiving portion 13 will be described.

When the collision load is input to the protection portion 31 as indicated by an open arrow in FIG. 9A, the input load is transmitted from the protection portion 31 to the attachment portion 32A and the attachment portion 32B.

The protector structure for the inverter 1 according to the present embodiment includes the protector 3 including the protection portion 31, the attachment portion 32A, and the attachment portion 32B. The protector 3 includes the constricted portion 33A as the low-strength portion between the protection portion 31 and the attachment portion 32A, and includes the constricted portion 33B as a low-strength portion between the protection portion 31 and the attachment portion 32B.

According to such a configuration, as illustrated in FIG. 9B, the protector 3 is deformed at the constricted portion 33A and the constricted portion 33B, and the protection portion 31 is pushed in by the load and abuts against the case 11. As a result, the load is also distributed to the protection portion 31, and is not concentrated on the attachment portion 32A and the attachment portion 32B. Therefore, according to such a configuration, breakage of the case 11 due to the collision load via the attachment portion 32A can be prevented.

In the present embodiment, the constricted portion 33A as the low-strength portion is a constricted portion including the constriction with respect to the protection portion 31 and the attachment portion 32A, and the constricted portion 33B as the low-strength portion is a constricted portion including the constriction with respect to the protection portion 31 and the attachment portion 32B.

According to such a configuration, by adjusting the widths of the constricted portion 33A and the constricted portion 33B, optimum load distribution of the collision load can be achieved. According to such a configuration, the protector 3 is easily deformed even by the corner portions 34A and the corner portions 34B where stress concentration occurs, which contributes to the prevention of the breakage of the case 11 due to the collision load.

Figure 10A:
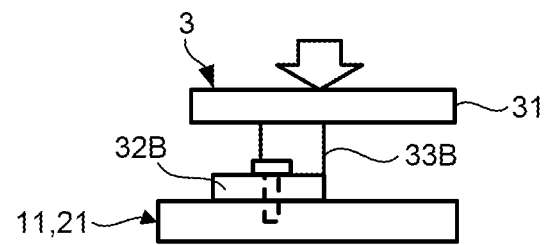
FIG. 10A is a first view of a second illustrative view of the deformation of the protector.
Figure 10B:
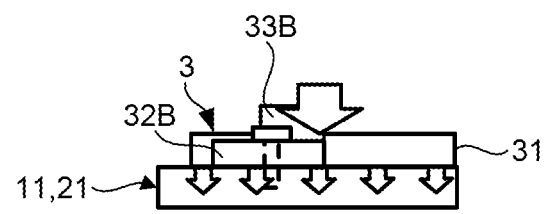
FIG. 10B is a second view of the second illustrative view of the deformation of the protector.
Figure 10C:
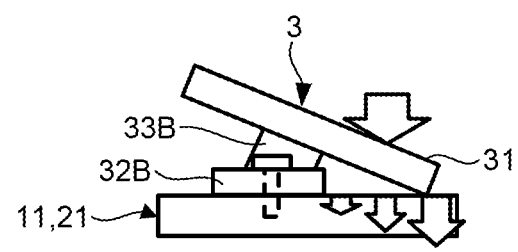
FIG. 10C is a third view of the second illustrative view of the deformation of the protector.

FIGS. 10A to 10C are second illustrative views of the deformation of the protector 3. FIGS. 10A to 10C are views of the protector 3 as viewed along an arrow A illustrated in FIG. 9A, and the case 11 is hidden behind the case 21. In FIGS. 10A to 10C, the attachment portion 32A and the constricted portion 33A are not illustrated. In FIGS. 10A to 10C, a case where the case 11 does not include the receiving portion 13 will be described.

First, FIG. 10C will be described. FIG. 10C shows a case of a comparative example. The comparative example shows a case where the region R and the protrusion 41 do not overlap each other when viewed along the vehicle front-rear direction. In this case, at the time of the vehicle collision, the load is easily input to a position deviated from the region R in the protection portion 31. When the load is input in this manner, the protector 3 is obliquely deformed, and the protection portion 31 is unevenly abutted against the case 11. As a result, distribution of the load transmitted from the protection portion 31 to the case 11 is non-uniform.

FIGS. 10A and 10B show the case of the present embodiment. In the present embodiment, the gravity center G of the protector 3 is disposed in the region R. The region R and the protrusion 41 overlap each other when viewed along the vehicle front-rear direction. According to these configurations, the load input into the region R can be transmitted to the attachment portion 32A and the attachment portion 32B in a well-balanced manner.

Therefore, in the case of the present embodiment, as illustrated in FIG. 10B, the protection portion 31 is pushed by the input load and abuts against the case 11 without largely disturbing a posture. As a result, since the load transmitted from the protection portion 31 to the case 11 is uniformly distributed, concentration of the collision load on the attachment portion 32A can be more appropriately prevented.

Figure 11A:
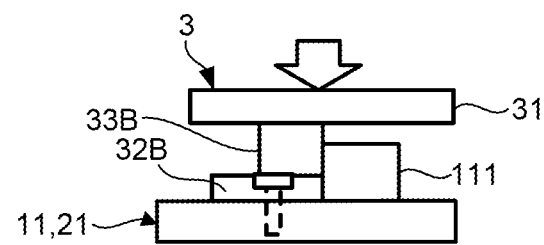
FIG. 11A is a first view of a third illustrative view of the deformation of the protector.
Figure 11B:
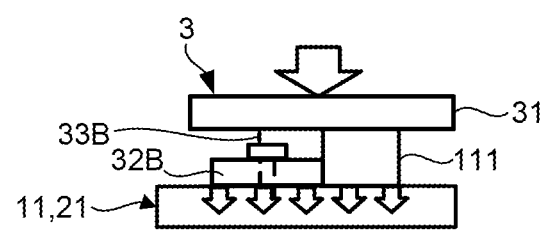
FIG. 11B is a second view of the third illustrative view of the deformation of the protector.
Figure 11C:
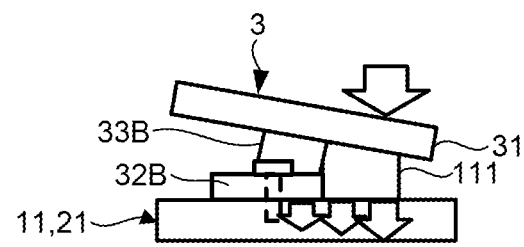
FIG. 11C is a third view of the third illustrative view of the deformation of the protector.

FIGS. 11A to 11C are third illustrative views of the deformation of the protector 3. FIGS. 11A and 11B illustrate a case where the load is input into the region R of the protection portion 31 at the time of the vehicle collision.

As illustrated in FIGS. 11A and 11B, the case 11 includes the receiving portion 13. According to such a configuration, the input load is transmitted to the attachment portion 32A and the attachment portion 32B in a well-balanced manner, and is further dispersed to the receiving portion 13. Therefore, even in this case, uniform distribution of the load transmitted to the case 11 can be achieved.

FIG. 11C shows a case where the collision load is input to a position deviated from the region R in the protection portion 31. In this case, as in the case of FIG. 10C, the protector 3 is deformed obliquely with respect to the input load. However, in a case where the case 11 includes the receiving portion 13, the protection portion 31 abuts against the receiving portion 13 before the protection portion 31 is largely inclined.

Therefore, according to such a configuration, even in the case where the collision load is input to the position deviated from the region R in the protection portion 31, the uniform distribution of the load transmitted to the case 11 can be achieved.

In the present embodiment, the receiving portion 13 is formed of the ribs having the mesh shape. A size of the cell of the mesh shape is set to be smaller than a size of the vertical cross section of the protrusion 41.

According to such a configuration, since the load transmitted from the protection portion 31 is received by the strong ribs, weight reduction can be achieved while achieving the uniform distribution of the load transmitted to the case 11.

The protector 3 may be configured as follows.

Figure 12:
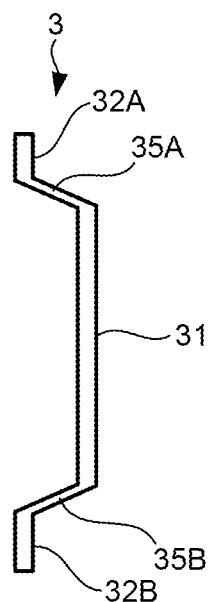
FIG. 12 is a view illustrating a first modification of the protector.

FIG. 12 is a view illustrating a first modification of the protector 3. As illustrated in FIG. 12, the protector 3 may include a thin portion 35A and a thin portion 35B instead of the constricted portion 33A and the constricted portion 33B. The thin portion 35A and the thin portion 35B are examples of a low rigidity portion, and are set to be thinner than the protection portion 31, the attachment portion 32A, and the attachment portion 32B, so that strength thereof is set to be lower than those of the protection portion 31, the attachment portion 32A, and the attachment portion 32B. Even in the case where the protector 3 is configured as described above, the breakage to the case 11 due to the collision load via the attachment portion 32A can be prevented.

Figure 13:
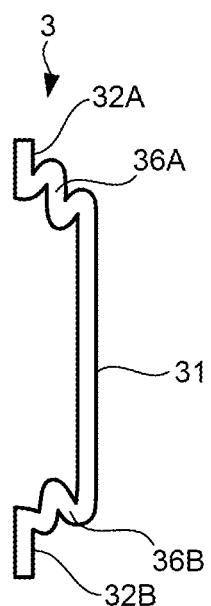
FIG. 13 is a view illustrating a second modification of the protector.

FIG. 13 is a view illustrating a second modification of the protector 3. As illustrated in FIG. 13, the protector 3 may include a bent portion 36A and a bent portion 36B instead of the constricted portion 33A and the constricted portion 33B. The bent portion 36A and the bent portion 36B are examples of a low rigidity portion, and have a bent shape, so that strength thereof is set to be lower than that of the protection portion 31, the attachment portion 32A, and the attachment portion 32B. Even in the case where the protector 3 is configured as described above, the breakage to the case 11 due to the collision load via the attachment portion 32A can be prevented.

Figure 14:
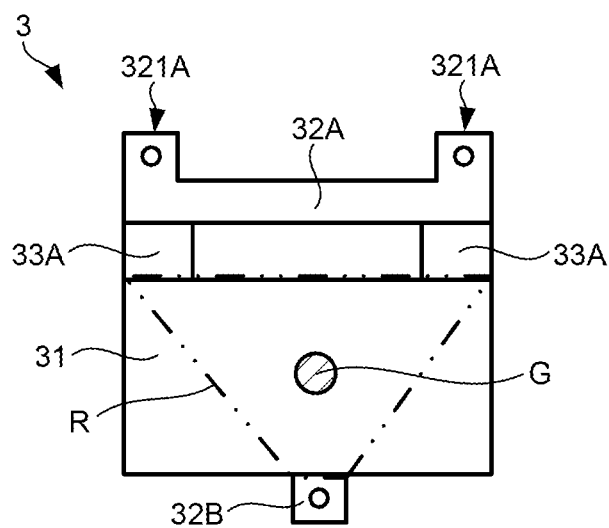
FIG. 14 is a view illustrating a third modification of the protector.

FIG. 14 is a view illustrating a third modification of the protector 3. In this example, two constricted portions 33A are provided between the protection portion 31 and the attachment portion 32A, and no constricted portion 33B is provided between the protection portion 31 and the attachment portion 32B. The constricted portions 33A are connected to both end portions of the attachment portion 32A, and a portion between the two constricted portions 33A is hollow. Each of the constricted portions 33A has a one-side constricted shape with respect to the attachment portion 32A.

The attachment portion 32A extends in a width direction and extends to sides opposite to constricted portion 33A sides at both end portions, and a bolt hole is provided in each of extending portions. The protector 3 includes the contact portions 321A on rear surfaces of the extending portions, and the constricted portions 33A are connected to the attachment portion 32A at positions where the two contact portions 321A are provided in the width direction by being connecting to the both end portions of the attachment portion 32A. Even in such a protector 3, a low-strength portion can be formed by the constricted portion 33A.

In this case, when roots of the constricted portions 33A and the attachment portion 32B are connected to each other, a strip-shaped region is formed, and the region R is a region surrounded by an outer edge of the region formed by connecting these roots one another. Therefore, the region R is formed by outer boundary lines of the strip-shaped region.

Therefore, in this case, the region R is a region surrounded by an outer edge of the region formed by connecting the roots of the two constricted portions 33A and the attachment portion 32B connected to the protection portion 31, that is, connecting connection base portions of the protection portion 31 with the attachment portion 32A and the attachment portion 32B.

The protector 3 can be configured such that the gravity center G is disposed in such a region R, and arrangements of the region R and the protrusion 41 can be the same as in the case of the present embodiment. The same applies to modifications described below.

Figure 15:
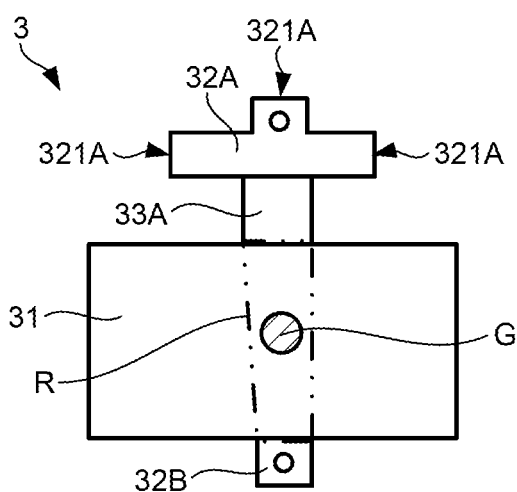
FIG. 15 is a view illustrating a fourth modification of the protector.

FIG. 15 is a view illustrating a fourth modification of the protector 3. In this example, the attachment portion 32A has an inverted T-shape. An extending portion at a center of the attachment portion 32A extends to a side opposite to the constricted portion 33A side. A bolt hole is provided in the extending portion at the center of the attachment portion 32A, and is not provided in extending portions on both sides.

In this example, the attachment portion 32A includes the contact portions 321A with the case 11 not only at the extending portion at the center in the width direction fixed by a bolt but also at the extending portions on the both sides in the width direction. The constricted portion 33A has a two-side constricted shape with respect to the attachment portion 32A by being connected to the attachment portion 32A at a position inside the two contact portions 321A on the both sides in the width direction. Even in such a protector 3, a low-strength portion can be formed by the constricted portion 33A.

Figure 16:
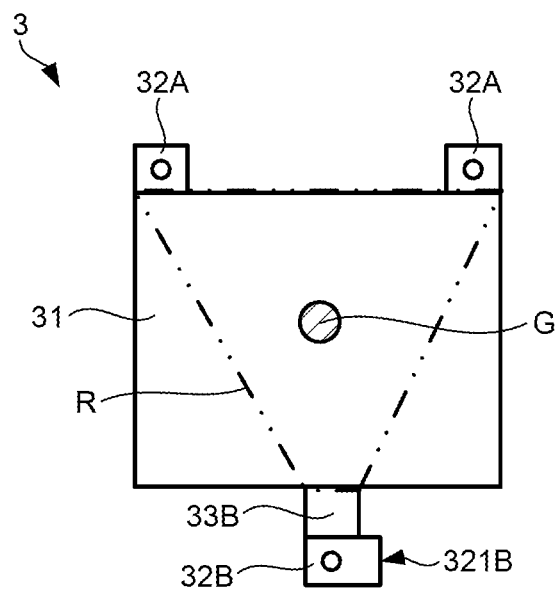
FIG. 16 is a view illustrating a fifth modification of the protector.

FIG. 16 is a view illustrating a fifth modification of the protector 3. In this example, the constricted portion 33B is provided between the protection portion 31 and the attachment portion 32B, and the constricted portion 33A is not provided between the protection portion 31 and the attachment portion 32A. The constricted portion 33B has a one-side constricted shape with respect to the attachment portion 32B. The protector 3 includes the contact portion 321B on the entire one surface (rear surface) of the attachment portion 32B, and the contact portion 321B is provided in a manner of overlapping with a region on an outer side in a width direction with respect to a width of a connection portion between the attachment portion 32B and the constricted portion 33B. Even in such a protector 3, a low-strength portion can be formed by the constricted portion 33B.

Figure 17:
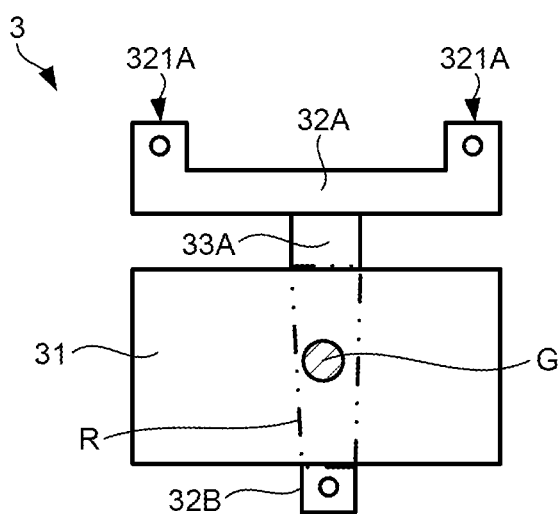
FIG. 17 is a view illustrating a sixth modification of the protector.

FIG. 17 is a view illustrating a sixth modification of the protector 3. In this example, the constricted portion 33A is provided between the protection portion 31 and the attachment portion 32A, and the constricted portion 33B is not provided between the protection portion 31 and the attachment portion 32B. The attachment portion 32A extends in a width direction and extends to a side opposite to the constricted portion 33A side at both end portions, and a bolt hole is provided in each of extending portions. The protector 3 includes the contact portions 321A on rear surfaces of the extending portions, and the constricted portion 33A is connected to the attachment portion 32A at a position inside the two contact portions 321A in the width direction by being connected to a central portion of the attachment portion 32A. Even in such a protector 3, a low-strength portion can be formed by the constricted portion 33A.

Figure 18:
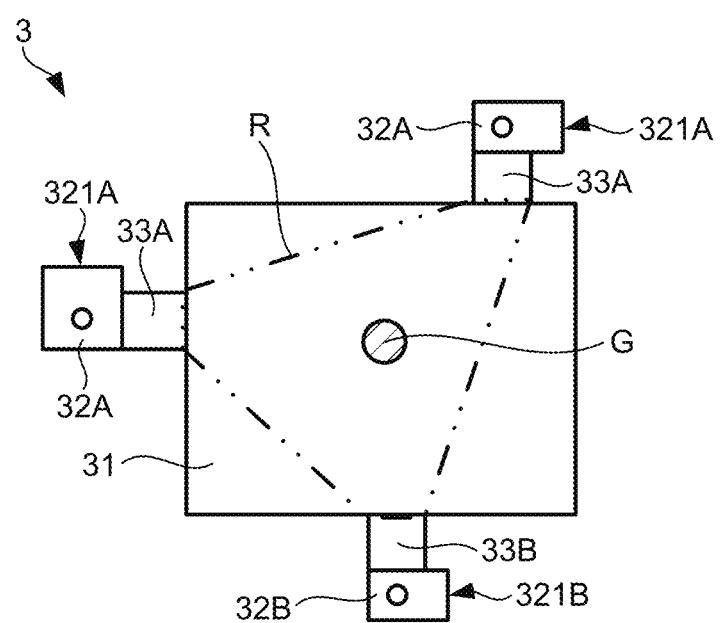
FIG. 18 is a view illustrating a seventh modification of the protector.

FIG. 18 is a view illustrating a seventh modification of the protector 3. In this example, the attachment portions 32A are respectively connected to an upper portion and one side portion of the protection portion 31 via the constricted portions 33A. The constricted portions 33A have a one-side constricted shape with respect to the attachment portions 32A, and the constricted portion 33B has a one-side constricted shape with respect to the attachment portion 32B. The protector 3 includes the contact portions 321A on entire rear surfaces of the attachment portions 32A and the contact portion 321B on an entire rear surface of the attachment portion 32B. Even in such a protector 3, a low-strength portion can be formed by the constricted portions 33A and the constricted portion 33B.

Although the embodiment of the present invention has been described above, the above-described embodiment is merely a part of application examples of the present invention, and does not mean that the technical scope of the present invention is limited to the specific configurations of the above-described embodiment.

For example, in the above-described embodiment, a case where the inverter 1 constitutes the electrical component has been described. However, the electrical component may be a DC-DC converter, a charging port, a junction box having a function of distributing a high voltage path, or the like.

The invention claimed is:

1. A protector structure for an electrical component that comprises a case, the protector structure comprising:
   a protector including:
      a protection portion configured to protect the electrical component from a collision of a colliding object, and
      a plurality of attachment portions attaching the protecting portion to the electrical component; wherein:
         each of the plurality of attachment portions comprises a contact portion coupled to the electrical component by a bolt, and in surface contact with the electrical component,
         the protection portion has a flat plate shape;
      one or more constricted portions between the protection portion and a respective attachment portion; wherein the one or more constricted portions have:
         a constriction with respect to the protection portion and the respective attachment portion, and
         a lower strength than the protection portion and the respective attachment portion.

2. The protector structure for the electrical component according to claim 1, wherein:
   a gravity center of the protector is disposed in a region surrounded by an outer edge of a region formed by connecting connection base portions of the protection portion with the plurality of the attachment portions.

3. The protector structure for the electrical component according to claim 1, wherein:
   a region surrounded by an outer edge of a region formed by connecting connection base portions of the protection portion with the plurality of the attachment portions and a collision portion of the colliding object overlap each other when viewed along a vehicle front-rear direction.

4. The protector structure for the electrical component according to claim 1, wherein:
   the case includes a receiving portion that is raised higher than a surrounding position at a portion where the protection portion faces.

5. The protector structure for the electrical component according to claim 4, wherein:
   the receiving portion is formed of a rib having a mesh shape, and
   a size of a cell of the mesh shape is smaller than a size of a collision cross section of a collision portion of the colliding object.

6. The protector structure for the electrical component of claim 1, wherein:
   at least one of the plurality of attachment portions is coupled directly to the protection portion without the one or more of the constriction portions therebetween.

7. The protector structure for the electrical component of claim 1, wherein:
   each of the plurality of attachment portions is coupled to at least one of the one or more constriction portions.

* * * * *